(12) United States Patent
Heydarian et al.

(10) Patent No.: US 7,636,913 B2
(45) Date of Patent: Dec. 22, 2009

(54) SYSTEM AND METHOD FOR EVALUATING AN EXPRESSION IN A DEBUGGER

(75) Inventors: Habib Heydarian, Kirkland, WA (US); James P. Griesmer, Monroe, WA (US)

(73) Assignee: Microsoft Corporation, Redmond, WA (US)

( * ) Notice: Subject to any disclaimer, the term of this patent is extended or adjusted under 35 U.S.C. 154(b) by 938 days.

(21) Appl. No.: 11/158,700

(22) Filed: Jun. 22, 2005

(65) Prior Publication Data

US 2007/0011515 A1    Jan. 11, 2007

(51) Int. Cl.
    *G06F 9/44* (2006.01)
(52) U.S. Cl. .................. 717/124; 717/125; 717/126; 717/127; 717/128; 717/131
(58) Field of Classification Search ......... 717/124–128, 717/131
    See application file for complete search history.

(56) References Cited

U.S. PATENT DOCUMENTS

| | | | |
|---|---|---|---|
| 5,410,696 A * | 4/1995 | Seki et al. ............... | 717/149 |
| 5,845,121 A * | 12/1998 | Carter .................... | 717/131 |
| 5,956,512 A * | 9/1999 | Simmons et al. ......... | 717/128 |
| 6,848,097 B1 * | 1/2005 | Alverson et al. ......... | 717/124 |
| 7,383,538 B2 * | 6/2008 | Bates et al. ............. | 717/128 |
| 7,478,366 B2 * | 1/2009 | Bickson et al. .......... | 717/124 |
| 2007/0192760 A1 * | 8/2007 | Vasey ..................... | 717/124 |

OTHER PUBLICATIONS

Kessler, P. B. "Fast Breakpoints: Design and Implementation", 2003, ACM, p. 390-397.*

* cited by examiner

*Primary Examiner*—Qamrun Nahar
(74) *Attorney, Agent, or Firm*—Woodcock Washburn LLP (57) ABSTRACT

When an expression is first entered into a debugger, the expression may be automatically evaluated. Later, when the debugger detects an action that causes the value of the expression to become stale, the expression may be reevaluated with a setting to disable the automatic reevaluation of certain designated disabled expressions. The disabled expressions may be expressions such as, for example, explicit expressions, which are more likely to result in side effects. Alternatively, for even greater protection against side effects, the disabled expressions may include both explicit and implicit expressions.

20 Claims, 9 Drawing Sheets

```
using System;                                           300 class Program
{
    static void Main(string[] args)
    {
        int x = 0;         ────────▶ (A)

x = 5;             ────────▶ (B)

Example e = new Example();

int result = e.Square(x);
    }
} class Example
{
    public int Square(int x)
    {
        return (x * x);
    }
}
```

Fig. 4

| NAME | VALUE | TYPE |
|---|---|---|
| Expression Interface 105 ||| 
| e.Square (x) | | |
| | | |

Fig. 5

| Expression Interface 105 | | |
|---|---|---|
| NAME | VALUE | TYPE |
| e.Square (x) | 0 | int |

| NAME | VALUE | TYPE |
|---|---|---|
| Expression Interface 105 ||||
| e.Square (x) | 25 | int |
|  |  |  |

SYSTEM AND METHOD FOR EVALUATING AN EXPRESSION IN A DEBUGGER

FIELD OF THE INVENTION

The present invention relates to the field of software development, and, more specifically, to evaluating an expression while debugging a software application.

BACKGROUND OF THE INVENTION

When a computing application is being debugged, evaluating certain expressions may cause unwanted and unexpected side effects or errors. Unless otherwise indicated, the term expression, as used herein, refers to any method, property, or other related function that either requires code to be run in the application being debugged or causes a change to the internal state of the application being debugged to successfully derive its value. These side effects may include, for example, changes in value to underlying data or changes in the state of the application itself. These side effects may disturb the debugging process by, for example, creating the appearance of non-existent bugs, or masking the appearance of existent bugs. These side effects may cause the application being debugged to hang or may even cause a complete crash of the application. In certain circumstances, side effects may cause an entire development environment to hang or crash.

A debugger typically cannot determine whether the evaluation of any particular expression will result in a side effect, but it can determine whether it has to execute a function in the process being debugged. Whenever the debugger has to call a function to evaluate an expression, there is a potential for a side effect to occur. However, depending on the expression being evaluated, a user may or may not be aware that a function is called. In particular, the evaluations of "properties" in modern languages such as C# or Java require a function call but are typically written such that they are less likely to result in side effects. By contrast, the evaluations of "member functions" are more likely to contain side effects. Additionally, there are other expressions, which are not properties or functions, that will, by definition, result in side effects. An example of this type of expression is the "i++" expression. The term implicit expression, as used herein, includes properties and other implicit function calls such as, for example, ToString( ). The term explicit expression, as used herein, refers to an expression that is either an obvious a function call or that obviously causes a side-effect.

When a user enters an expression into the debugger for the first time, the expression may be evaluated to determine its value. After an expression has already been evaluated, there are a number of actions which may cause the value of the expression to change. In particular, an expression's value may change when a user steps through a line of code in the debugger. Also, an expression's value may change when the context of the expression is changed by, for example, evaluating another expression, switching threads, changing a process, or switching call stack frames.

A limitation of conventional debuggers is that, upon the occurrence of one of these actions, they will automatically reevaluate the expression so that the value of the expression does not become stale. The term stale, as used herein, refers to a value that is not necessarily incorrect but which is out of date and may no longer be accurate. One problem with the automatic reevaluation of expressions is that it may result in one or more of the side effects discussed above. If an expression is explicit, then its automatic reevaluation is particularly problematic because, as discussed above, explicit expressions are more likely to result in side effects than are implicit expressions. Accordingly, there is a need in the art for a debugger that does not automatically reevaluate all expressions. Also, the value of expressions that do not involve function evaluations or other side-effects can become stale. For example, if an expression represents a variable that has a value, the user could step to a function or alternate scope that doesn't contain that variable. At that point, the value of the variable being viewed becomes stale. The expression's value will remain stale until its value can be successfully refreshed to be a non-error, or the user explicitly forces it to be refreshed. In prior implementations, an error string would typically be shown indicating that the expression is no longer valid in the new scope. In other words, the new value would be shown as an error.

SUMMARY OF THE INVENTION

The present invention is directed to systems and methods for evaluating an expression in a debugger. When the expression is first entered into the debugger, the expression may be automatically evaluated, performing any necessary function evaluation and/or side-effects to derive the current value. Later, when the debugger detects an action that causes the value of an expression to become stale, the expression may be reevaluated with a setting to disable the automatic reevaluation of selected disabled expressions. The disabled expressions are expressions whose automatic reevaluation have been disabled. The disabled expressions may be expressions such as, for example, explicit expressions, which are more likely to result in side effects. Alternatively, for even greater protection against side effects, the disabled expressions may include both explicit and implicit expressions.

According to an aspect of the invention, if the expression is a disabled expression, then an evaluation error may be generated upon attempting to automatically reevaluate the expression. Evaluation errors may also be generated if, for example, a variable is out of scope or if the evaluation process exceeds a specified time limit. When the expression is first evaluated or is manually refreshed from a stale state, a long time period may be used to limit the evaluation process. Later, during automatic reevaluations, a short time period may be used.

According to another aspect of the invention, if an evaluation error is generated, then the debugger may indicate that the expression needs to be refreshed. This may be indicated by, for example, displaying the expression in grayed out font and displaying a refresh icon adjacent to the expression. The expression may then be manually refreshed by, for example, activating the refresh icon adjacent to the expression.

Additional features and advantages of the invention will be made apparent from the following detailed description of illustrative embodiments that proceeds with reference to the accompanying drawings.

BRIEF DESCRIPTION OF THE DRAWINGS

The illustrative embodiments will be better understood after reading the following detailed description with reference to the appended drawings, in which.

DETAILED DESCRIPTION OF ILLUSTRATIVE EMBODIMENTS

The subject matter of the present invention is described with specificity to meet statutory requirements. However, the description itself is not intended to limit the scope of this patent. Rather, the inventors have contemplated that the claimed subject matter might also be embodied in other ways, to include different acts or elements similar to the ones described in this document, in conjunction with other present or future technologies.

Figure 1:
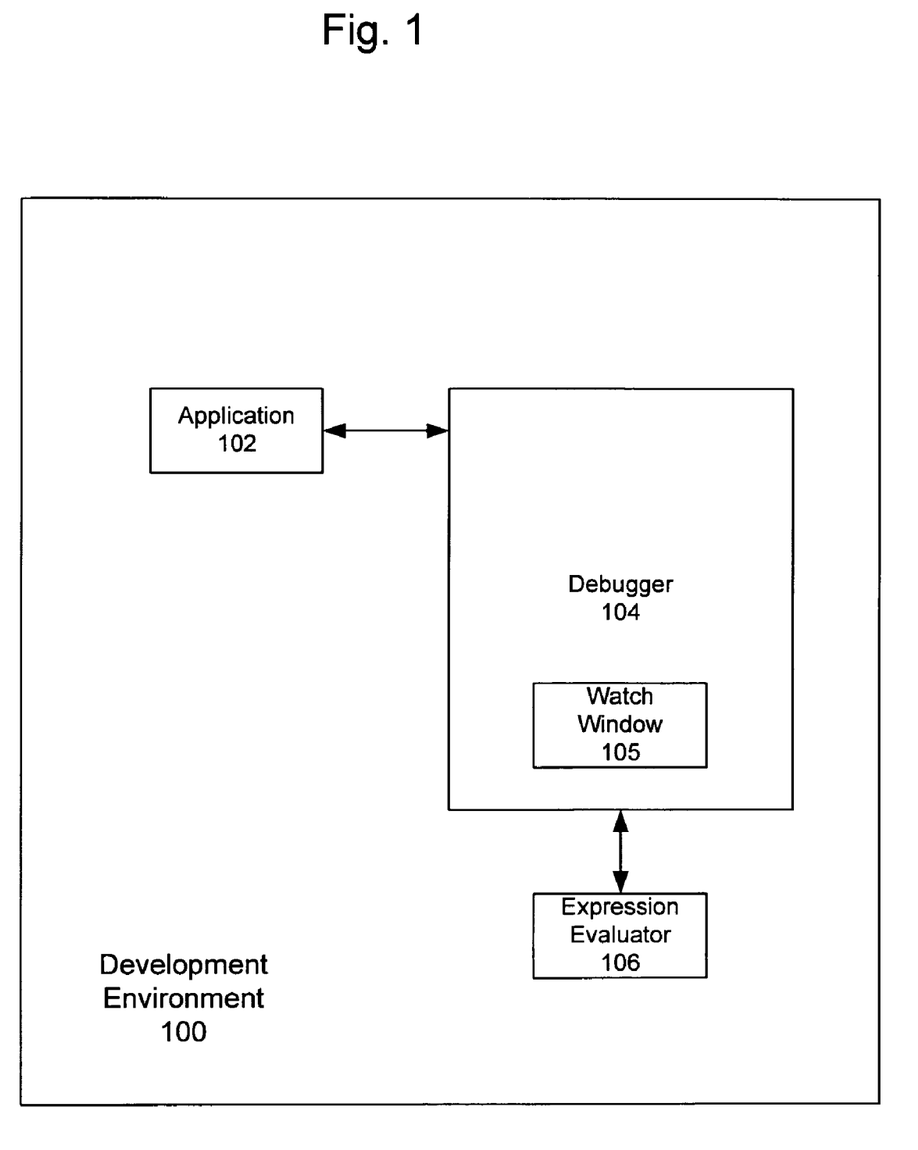
FIG. 1 depicts an exemplary development environment in accordance with the present invention.

An exemplary development environment in accordance with the present invention is shown in FIG. 1. Generally, debugger 104 may be used to identify and resolve errors that prevent application 102 from running correctly. Such errors may be, for example, syntax errors, semantic errors, and logic errors. Debugger 104 may include an expression interface 105 for displaying the value of one or more expressions during a debugging session. Expression interface 105 may be, for example, a Visual Studio™ Watch window or a Visual Studio™ QuickWatch dialog box, or a Visual Studio™ Enhanced Datatip, all features of the Visual Studio™ integrated development environment from MICROSOFT Corp. of Redmond, Wash.

The present invention enables debugger 104 to be set to disable the automatic reevaluation of selected expressions. The disabled expressions may be expressions such as, for example, explicit expressions, which are more likely to result in side effects. Alternatively, for even greater protection against side effects, the disabled expressions may include both explicit and implicit expressions. Additionally, the present invention may enable debugger 104 to request that the expression evaluation process occur within a specified time limit. The length of this time limit may vary depending upon the circumstances of the evaluation process.

Expression evaluator 106 evaluates expressions upon requests from debugger 104 and returns the values of the evaluated expressions to debugger 104. Also, if an error occurs during the evaluation process, then expression evaluator 106 may return an appropriate error message to debugger 104. Expression evaluator 106 may perform the evaluations in accordance with the settings of debugger 104. For example, if debugger 104 is set to disable automatic reevaluation of explicit expressions, and debugger 104 sends an explicit expression to expression evaluator 106 for evaluation, then expression evaluator 106 may return an appropriate error message to debugger 104. Also, for example, if debugger 104 is set to require that the evaluation process be completed within a certain time period, and expression evaluator 106 fails to do so, then expression evaluator 106 may also return an appropriate error message to debugger 104. Expression evaluator 106 may also return error messages to debugger 104 for other errors occurring during the evaluation process such as, for example, if a variable is out of scope.

Figure 2:
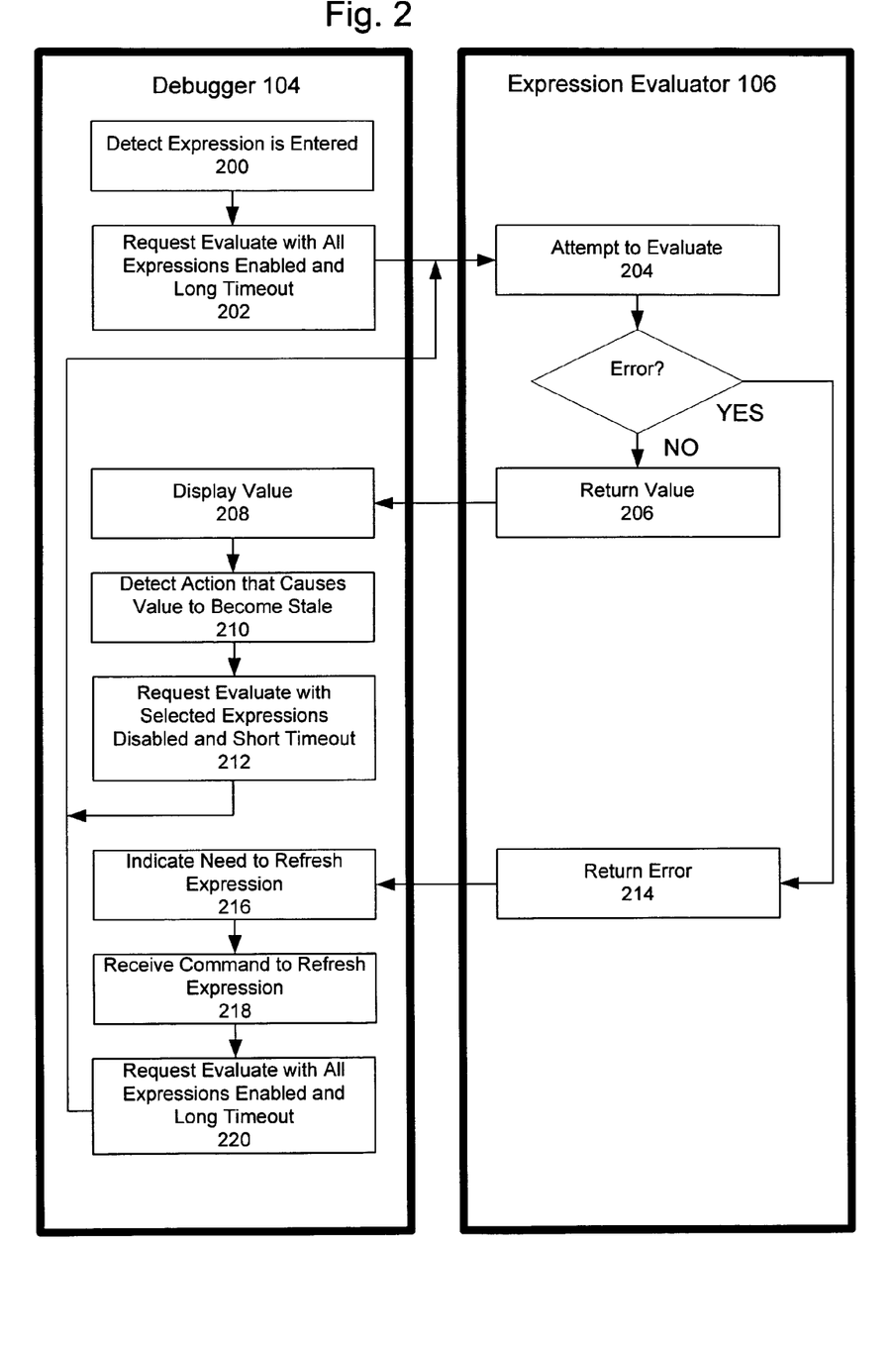
FIG. 2 is a flowchart of an exemplary method for evaluating an expression in accordance with the present invention.
Figure 3:
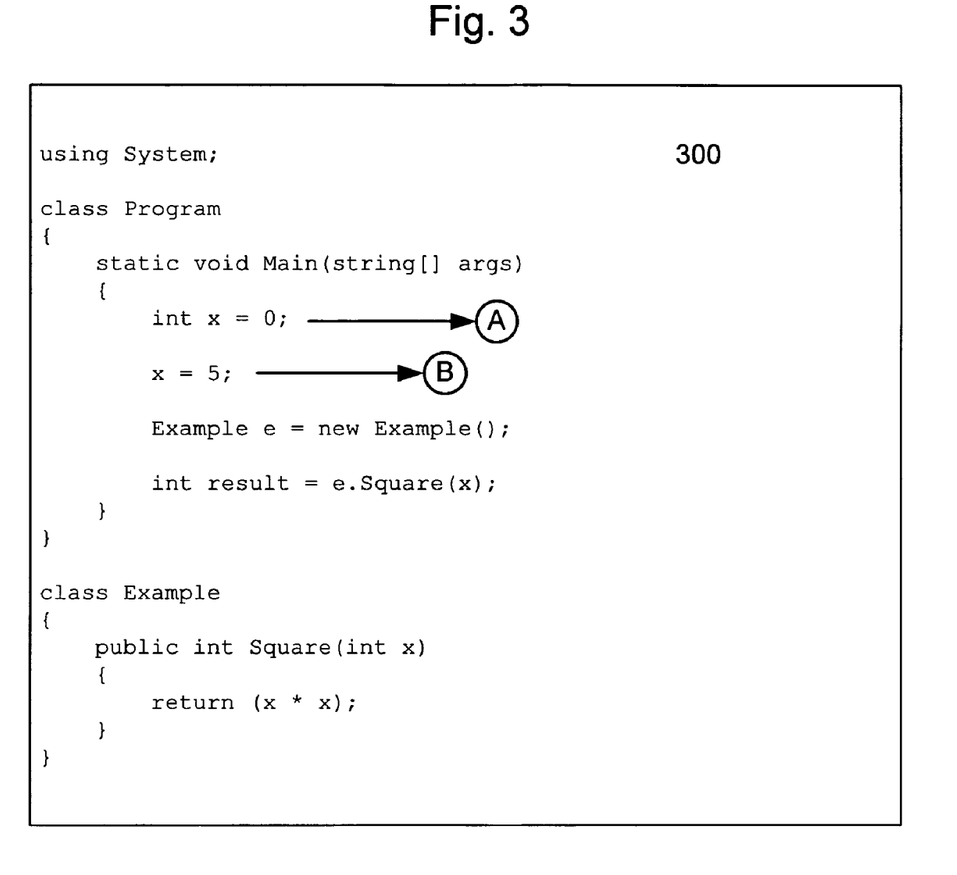
FIG. 3 depicts exemplary debugger code in accordance with the present invention.
Figure 4:
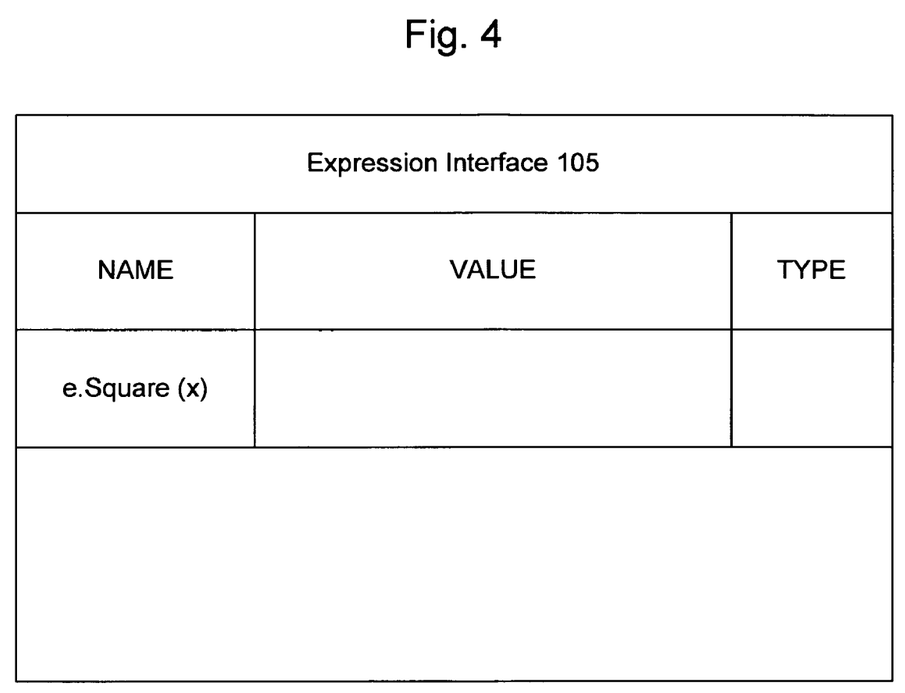
FIG. 4 depicts an exemplary watch window with a newly entered expression in accordance with the present invention.

An exemplary method for evaluating an expression in accordance with the present invention is depicted in FIG. 2. The exemplary method depicted in FIG. 2 will be described with reference to some exemplary debugger code 300, which is depicted in FIG. 3. To initiate the exemplary method of FIG. 2, at act 200, debugger 104 detects a newly entered expression. FIG. 4 depicts an exemplary expression "e.Square(x)", which has been newly entered into expression interface 105. As shown, "e.Square(x)" has not yet been evaluated and, accordingly, has no value displayed for its corresponding value entry or type entry.

In response to detecting the expression, at act 202, debugger 104 sends a command to expression evaluator 106 to perform an initial evaluation of the expression. For the initial evaluation, debugger 104 will be set to enable automatic reevaluation for all expressions. Debugger 104 may also be set to require that the evaluation be performed within a long time period.

Figure 5:
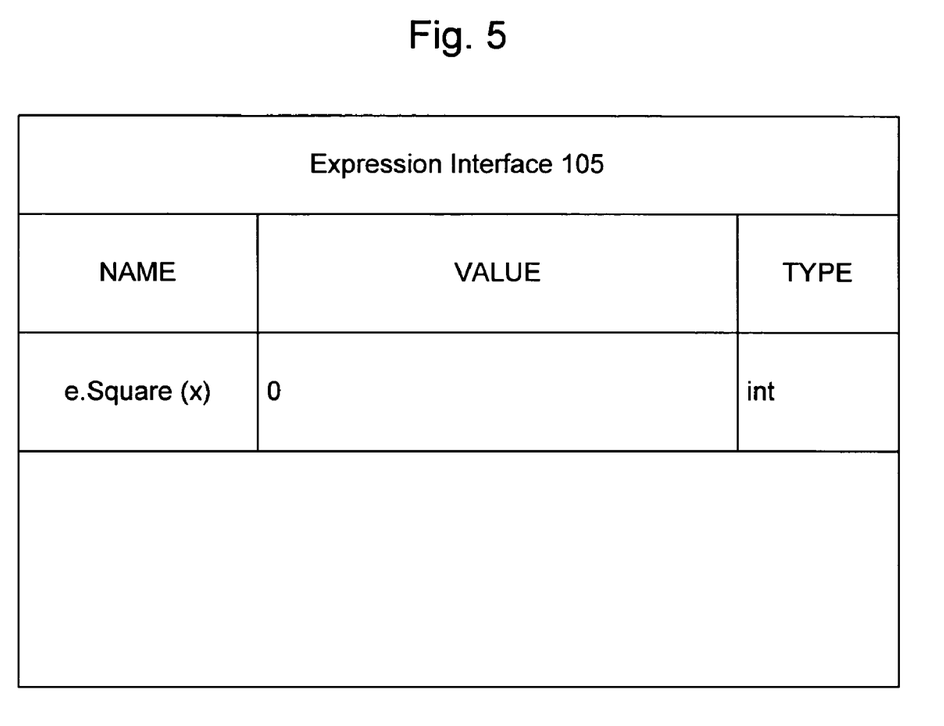
FIG. 5 depicts an exemplary watch window with a newly entered expression after its initial evaluation in accordance with the present invention.

At act 204, expression evaluator 106 attempts to evaluate the expression. If there are no errors during the evaluation process, then, at act 206, expression evaluator 106 returns the value of the expression to debugger 104. For example, if the debugger code 300 of FIG. 3 is at line "A" (int x=0) when the expression "e.Square(x)" is first entered, then, for the initial evaluation of "e.Square(x)", expression evaluator 106 will return a value of zero and a type of integer. At act 208, debugger 104 displays the value of the expression returned from expression evaluator 106. An exemplary display of "e.Square(x)" after its initial evaluation is depicted in FIG. 5. As shown, the value of zero and the type of "int" have been added to expression interface 105.

At act 210, debugger 104 detects an action that causes the expression to become stale. This action may be, for example, evaluating another expression, switching threads, changing a process, or switching call stack frames. Additionally, the expression may become stale when a user steps through a line of code in the debugger 104. For example, referring to code 300 of FIG. 3, when a user steps from line "A" (int x=0) to line "B" (x=5), then the value of "e.Square(x)" will change from zero to five. In response to detecting that the value of the expression is stale, at act 212, debugger 104 sends a command to expression evaluator 106 to reevaluate the expression. At act 212, to avoid the occurrence of potential side effects, debugger 104 will disable automatic reevaluation of the selected expressions. Also, debugger 104 will decrease the required time period in which expression evaluator 106 must complete the evaluation.

Once again, at act 204, expression evaluator 106 will attempt to evaluate the expression. If the expression being evaluated is a disabled expression, then an error will occur and the evaluation will not succeed. For example, because "e.Square(x) is an explicit expression, if debugger 104 is set to disable automatic reevaluation of explicit expressions, then the evaluation of "e.Square(x)" will not succeed and, at act 214, expression evaluator 106 will return an error message to debugger 104.

If, at act 214, an error message is returned, then, at act 216, debugger 104 will indicate that the expression needs to be refreshed. This may be indicated by changing the expression's font and displaying a refresh icon adjacent to the value of the expression. The refresh icon may, for example, be made up of two connected clockwise pointing semi-circular arrows.

Figure 6:
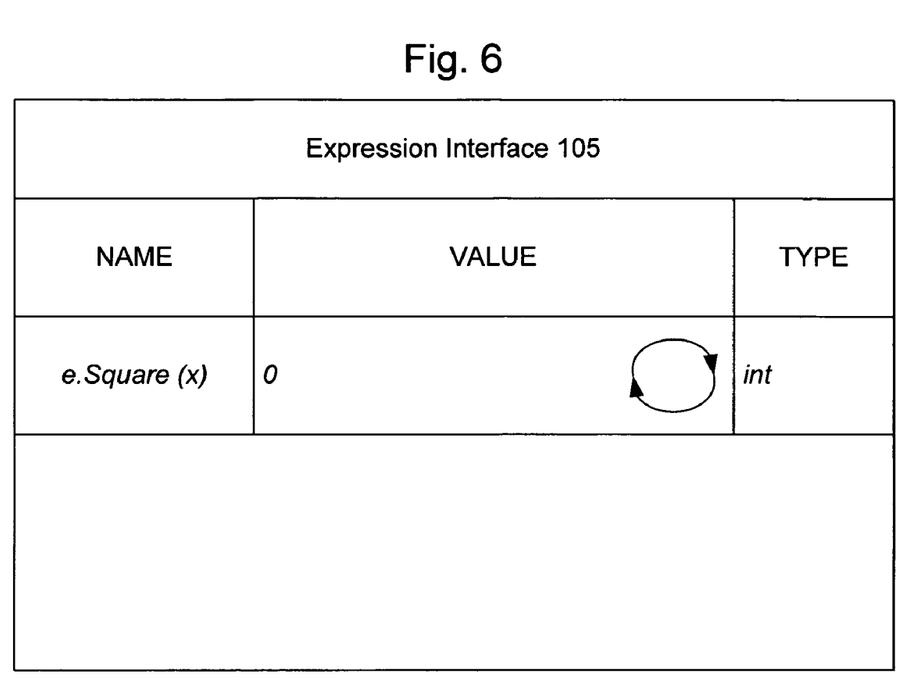
FIG. 6 depicts an exemplary watch window with an expression that needs to be refreshed in accordance with the present invention.

An exemplary indication that "e.Square(x)" needs to be refreshed is displayed in FIG. 6. As shown, expression interface 105 now displays "e.Square(x)" in italics. Alternatively, rather than italics, the expression may be displayed in grayed out font or in another manner. Additionally, expression interface 105 now displays a black refresh icon adjacent to the expression. Alternatively, rather than in black, the refresh icon may be displayed in green or in another color. In addition, the user may find out what made the expression stale by hovering over the refresh icon. The error or situation that occurred may be displayed in a tooltip.

Figure 7:
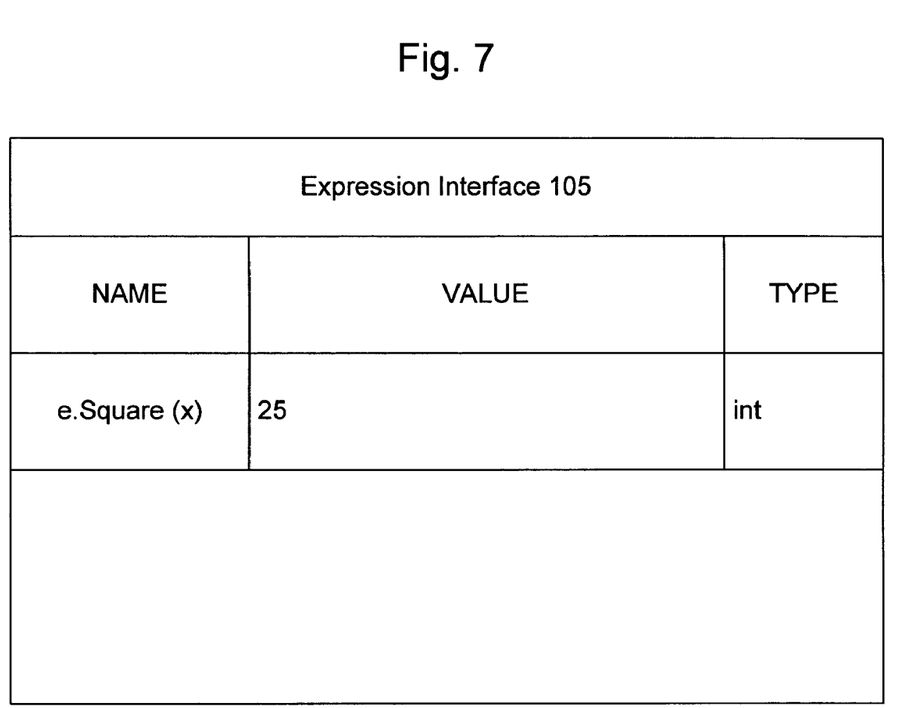
FIG. 7 depicts an exemplary watch window with a refreshed expression in accordance with the present invention.

At act 218, debugger 104 receives a command to manually refresh the expression. The command may be issued by, for example, activating the refresh icon. The refresh icon may be activated by, for example, clicking on the icon using an attached mouse. In response to receiving the refresh command, at act 220, debugger 104 sends a command to expression evaluator 106 to reevaluate the expression. At act 220, debugger 104 will be set to enable automatic reevaluation for all expression types, explicit or implicit. Debugger 104 may also be set to require that the evaluation be performed within a long time period. If the expression is successfully reevaluated, then, at act 208, its new refreshed value will be displayed. An exemplary display of the refreshed value for "e.Square(x)" is show in FIG. 7. Expression interface 105 now displays the expression's new value of twenty-five, and the refresh icon and the italic font have been removed. As should be appreciated, the expression interface 105 which has been depicted in FIGS. 4-7 may include multiple expressions, and, each time one of the expressions is evaluated, the other expressions may become stale and need to be refreshed as described above.

Accordingly, as set forth above with reference to FIGS. 1-7, the present invention provides systems and methods for evaluating an expression in a debugger. As is apparent from the above, all or portions of the various systems, methods, and aspects of the present invention may be embodied in hardware, software, or a combination of both. When embodied in software, the methods and apparatus of the present invention, or certain aspects or portions thereof, may be embodied in the form of program code (i.e., instructions). This program code may be stored on a computer-readable medium, such as a magnetic, electrical, or optical storage medium, including without limitation a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer or server, the machine becomes an apparatus for practicing the invention. A computer on which the program code executes will generally include a processor, a storage medium readable by the processor (including volatile and non-volatile memory and/or storage elements), at least one input device, and at least one output device. The program code may be implemented in a high level procedural or object oriented programming language. Alternatively, the program code can be implemented in an assembly or machine language. In any case, the language may be a compiled or interpreted language.

The present invention may also be embodied in the form of program code that is transmitted over some transmission medium, such as over electrical wiring or cabling, through fiber optics, over a network, including a local area network, a wide area network, the Internet or an intranet, or via any other form of transmission, wherein, when the program code is received and loaded into and executed by a machine, such as a computer, the machine becomes an apparatus for practicing the invention.

When implemented on a general-purpose processor, the program code may combine with the processor to provide a unique apparatus that operates analogously to specific logic circuits.

Moreover, the invention can be implemented in connection with any computer or other client or server device, which can be deployed as part of a computer network, or in a distributed computing environment. In this regard, the present invention pertains to any computer system or environment having any number of memory or storage units, and any number of applications and processes occurring across any number of storage units or volumes, which may be used in connection with processes for persisting objects in a database store in accordance with the present invention. The present invention may apply to an environment with server computers and client computers deployed in a network environment or distributed computing environment, having remote or local storage. The present invention may also be applied to standalone computing devices, having programming language functionality, interpretation and execution capabilities for generating, receiving and transmitting information in connection with remote or local services.

Distributed computing facilitates sharing of computer resources and services by exchange between computing devices and systems. These resources and services include, but are not limited to, the exchange of information, cache storage, and disk storage for files. Distributed computing takes advantage of network connectivity, allowing clients to leverage their collective power to benefit the entire enterprise. In this regard, a variety of devices may have applications, objects or resources that may implicate processing performed in connection with the object persistence methods of the present invention.

Figure 8:
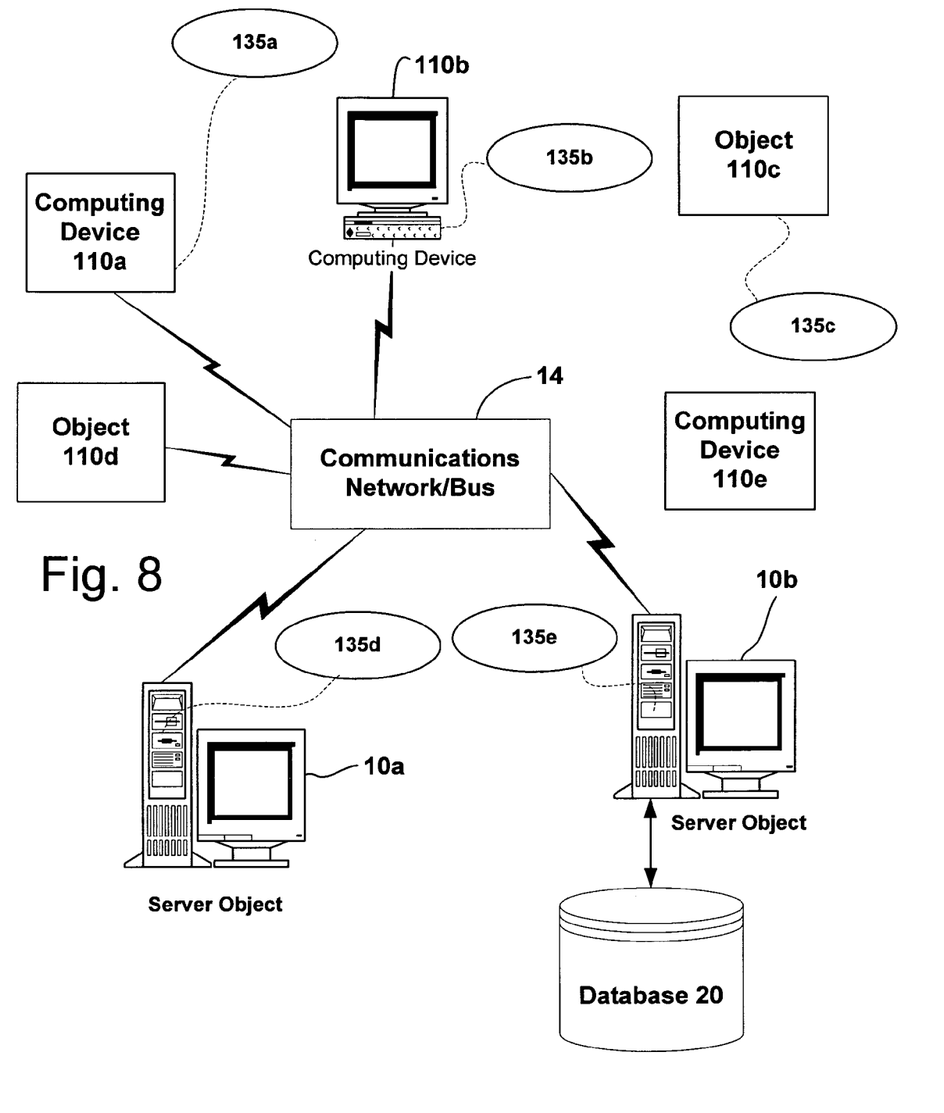
FIG. 8 is a block diagram representing an exemplary network environment having a variety of computing devices in which the present invention may be implemented.

FIG. 8 provides a schematic diagram of an exemplary networked or distributed computing environment. The distributed computing environment comprises computing objects 10a, 10b, etc. and computing objects or devices 110a, 110b, 110c, etc. These objects may comprise programs, methods, data stores, programmable logic, etc. The objects may comprise portions of the same or different devices such as PDAs, televisions, MP3 players, personal computers, etc. Each object can communicate with another object by way of the communications network 14. This network may itself comprise other computing objects and computing devices that provide services to the system of FIG. 8, and may itself represent multiple interconnected networks. In accordance with an aspect of the invention, each object 10a, 10b, etc. or 110a, 110b, 110c, etc. may contain an application that might make use of an API, or other object, software, firmware and/or hardware, to request use of the processes used to implement the object persistence methods of the present invention.

It can also be appreciated that an object, such as 110c, may be hosted on another computing device 10a, 10b, etc. or 110a, 110b, etc. Thus, although the physical environment depicted may show the connected devices as computers, such illustration is merely exemplary and the physical environment may alternatively be depicted or described comprising various digital devices such as PDAs, televisions, MP3 players, etc., software objects such as interfaces, COM objects and the like.

There are a variety of systems, components, and network configurations that support distributed computing environments. For example, computing systems may be connected together by wired or wireless systems, by local networks or widely distributed networks. Currently, many of the networks are coupled to the Internet, which provides the infrastructure for widely distributed computing and encompasses many different networks. Any of the infrastructures may be used for exemplary communications made incident to the present invention.

The Internet commonly refers to the collection of networks and gateways that utilize the TCP/IP suite of protocols, which are well-known in the art of computer networking. TCP/IP is an acronym for "Transmission Control Protocol/Internet Protocol." The Internet can be described as a system of geographically distributed remote computer networks interconnected by computers executing networking protocols that allow users to interact and share information over the network(s). Because of such wide-spread information sharing, remote networks such as the Internet have thus far generally evolved into an open system for which developers can design software applications for performing specialized operations or services, essentially without restriction.

Thus, the network infrastructure enables a host of network topologies such as client/server, peer-to-peer, or hybrid architectures. The "client" is a member of a class or group that uses the services of another class or group to which it is not related. Thus, in computing, a client is a process, i.e., roughly a set of instructions or tasks, that requests a service provided by another program. The client process utilizes the requested service without having to "know" any working details about the other program or the service itself. In a client/server architecture, particularly a networked system, a client is usually a computer that accesses shared network resources provided by another computer, e.g., a server. In the example of. FIG. 8, computers 110a, 110b, etc. can be thought of as clients and computer 10a, 10b, etc. can be thought of as servers, although any computer could be considered a client, a server, or both, depending on the circumstances. Any of these computing devices may be processing data in a manner that implicates the object persistence techniques of the invention.

A server is typically a remote computer system accessible over a remote or local network, such as the Internet. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the persistence mechanism of the invention may be distributed across multiple computing devices.

Client(s) and server(s) may communicate with one another utilizing the functionality provided by a protocol layer. For example, Hypertext Transfer Protocol (HTTP) is a common protocol that is used in conjunction with the World Wide Web (WWW), or "the Web." Typically, a computer network address such as an Internet Protocol (IP) address or other reference such as a Universal Resource Locator (URL) can be used to identify the server or client computers to each other. The network address can be referred to as a URL address. Communication can be provided over any available communications medium.

Thus, FIG. 8 illustrates an exemplary networked or distributed environment, with a server in communication with client computers via a network/bus, in which the present invention may be employed. The network/bus 14 may be a LAN, WAN, intranet, the Internet, or some other network medium, with a number of client or remote computing devices 110a, 110b, 110c, 110d, 110e, etc., such as a portable computer, handheld computer, thin client, networked appliance, or other device, such as a VCR, TV, oven, light, heater and the like in accordance with the present invention. It is thus contemplated that the present invention may apply to any computing device in connection with which it is desirable to maintain a persisted object.

In a network environment in which the communications network/bus 14 is the Internet, for example, the servers 10a, 10b, etc. can be servers with which the clients 110a, 110b, 110c, 110d, 110e, etc. communicate via any of a number of known protocols such as HTTP. Servers 10a, 10b, etc. may also serve as clients 110a, 110b, 110c, 110d, 110e, etc., as may be characteristic of a distributed computing environment.

Communications may be wired or wireless, where appropriate. Client devices 110a, 110b, 110c, 110d, 110e, etc. may or may not communicate via communications network/bus 14, and may have independent communications associated therewith. For example, in the case of a TV or VCR, there may or may not be a networked aspect to the control thereof. Each client computer 110a, 110b, 110c, 110d, 110e, etc. and server computer 10a, 10b, etc. may be equipped with various application program modules or objects 135 and with connections or access to various types of storage elements or objects, across which files or data streams may be stored or to which portion(s) of files or data streams may be downloaded, transmitted or migrated. Any computer 10a, 10b, 110a, 110b, etc. may be responsible for the maintenance and updating of a database, memory, or other storage element 20 for storing data processed according to the invention. Thus, the present invention can be utilized in a computer network environment having client computers 110a, 110b, etc. that can access and interact with a computer network/bus 14 and server computers 10a, 10b, etc. that may interact with client computers 110a, 110b, etc. and other like devices, and databases 20.

FIG. 8 and the following discussion are intended to provide a brief general description of a suitable computing device in connection with which the invention may be implemented. For example, any of the client and server computers or devices illustrated in FIG. 8 may take this form. It should be understood, however, that handheld, portable and other computing devices and computing objects of all kinds are contemplated for use in connection with the present invention, i.e., anywhere from which data may be generated, processed, received and/or transmitted in a computing environment. While a general purpose computer is described below, this is but one example, and the present invention may be implemented with a thin client having network/bus interoperability and interaction. Thus, the present invention may be implemented in an environment of networked hosted services in which very little or minimal client resources are implicated, e.g., a networked environment in which the client device serves merely as an interface to the network/bus, such as an object placed in an appliance. In essence, anywhere that data may be stored or from which data may be retrieved or transmitted to another computer is a desirable, or suitable, environment for operation of the object persistence methods of the invention.

Although not required, the invention can be implemented via an operating system, for use by a developer of services for a device or object, and/or included within application or server software that operates in accordance with the invention. Software may be described in the general context of computer-executable instructions, such as program modules, being executed by one or more computers, such as client workstations, servers or other devices. Generally, program modules include routines, programs, objects, components, data structures and the like that perform particular tasks or implement particular abstract data types. Typically, the functionality of the program modules may be combined or distributed as desired in various embodiments. Moreover, the invention may be practiced with other computer system configurations and protocols. Other well known computing systems, environments, and/or configurations that may be suitable for use with the invention include, but are not limited to, personal computers (PCs), automated teller machines, server computers, hand-held or laptop devices, multi-processor systems, microprocessor-based systems, programmable consumer electronics, network PCs, appliances, lights, environmental control elements, minicomputers, mainframe computers and the like.

Figure 9:
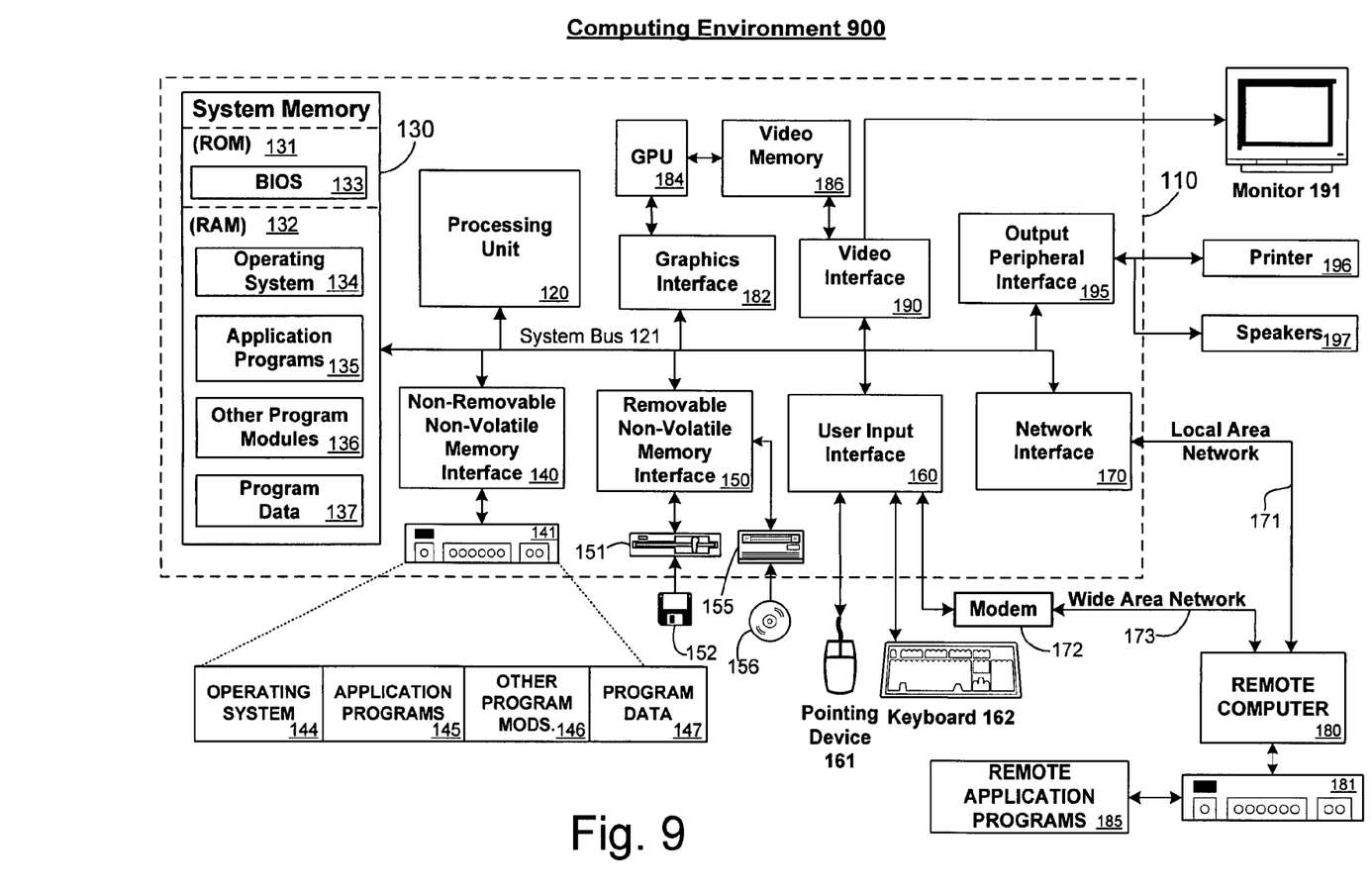
FIG. 9 is a block diagram of an exemplary representing an exemplary computing device in which the present invention may be implemented.

FIG. 9 thus illustrates an example of a suitable computing system environment 900 in which the invention may be implemented, although as made clear above, the computing system environment 900 is only one example of a suitable computing environment and is not intended to suggest any limitation as to the scope of use or functionality of the invention. Neither should the computing environment 900 be interpreted as having any dependency or requirement relating to any one or combination of components illustrated in the exemplary operating environment 900.

With reference to FIG. 9, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media include both volatile and nonvolatile, removable and non-removable media implemented in any method or technology for storage of information such as computer readable instructions, data structures, program modules or other data. Computer storage media include, but are not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 110. Communication media typically embody computer readable instructions, data structures, program modules or other data in a modulated data signal such as a carrier wave or other transport mechanism and include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 9 illustrates operating system 134, application programs 135, other program modules 136, and program data 137.

The computer 110 may also include other removable/non-removable, volatile/nonvolatile computer storage media. By way of example only, FIG. 8 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD-RW, DVD-RW or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 9 provide storage of computer readable instructions, data structures, program modules and other data for the computer 110. In FIG. 9, for example, hard disk drive 141 is illustrated as storing operating system 144, application programs 145, other program modules 146 and program data 147. Note that these components can either be the same as or different from operating system 134, application programs 135, other program modules 136 and program data 137. Operating system 144, application programs 145, other program modules 146 and program data 147 are given different numbers here to illustrate that, at a minimum, they are different copies. A user may enter commands and information into the computer 110 through input devices such as a keyboard 162 and pointing device 161, such as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB). A graphics interface 182 may also be connected to the system bus 121. One or more graphics processing units (GPUs) 184 may communicate with graphics interface 182. A monitor 191 or other type of display device is also connected to the system bus 121 via an interface, such as a video interface 190, which may in turn communicate with video memory 186. In addition to monitor 191, computers may also include other peripheral output devices such as speakers 197 and printer 196, which may be connected through an output peripheral interface 195.

The computer 110 may operate in a networked or distributed environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 9. The logical connections depicted in FIG. 9 include a local area network (LAN) 171 and a wide area network (WAN) 173, but may also include other networks/buses. Such networking environments are commonplace in homes, offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 9 illustrates remote application programs 185 as residing on memory device 181. It will be appreciated that the network connections shown are exemplary and other means of establishing a communications link between the computers may be used.

CONCLUSION

Thus, systems and methods for evaluating an expression in a debugger have been disclosed. While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather should be construed in breadth and scope in accordance with the appended claims.

What is claimed:

1. A computer-implemented method for evaluating an expression, the computer-implemented method comprising:
    using a computer to perform an initial evaluation of the expression with a debugger set to enable automatic reevaluation of all expressions within a first time period of a corresponding first evaluation of the expressions;
    detecting an action that causes a value of the expression to become stale, wherein the following actions cause the expression to become stale: evaluating another expression, switching threads, changing a process, switching call stack frames or when a user steps through a line of code in the debugger;
    setting the debugger to disable automatic reevaluation of selected expressions;
    decreasing a time period during which reevaluation of expressions must be completed to a second time period shorter than the first time period; and
    responsively evaluating the expression.

2. The computer-implemented method of claim 1, further comprising setting the debugger to disable automatic reevaluation of explicit expressions.

3. The computer-implemented method of claim 1, further comprising setting the debugger to disable automatic reevaluation of explicit and implicit expressions.

4. The computer-implemented method of claim 3, further comprising:
    if the second time period expires prior to completing reevaluation of the expression, then determining that an evaluation error has occurred.

5. The computer-implemented method of claim 1, further comprising determining that an evaluation error has occurred if the expression corresponds to the selected expressions.

6. The computer-implemented method of claim 1, further comprising indicating that the expression needs to be refreshed if an evaluation error occurs while evaluating the expression.

7. The computer-implemented method of claim 6, comprising indicating that the expression needs to be refreshed by displaying the expression in grayed out font and displaying a refresh icon adjacent to the expression.

8. The computer-implemented method of claim 1, further comprising:
    receiving a command to refresh the expression; and
    responsive to the command, reevaluating the expression.

9. The computer-implemented method of claim 8, wherein receiving a command to refresh the expression comprises detecting that a refresh icon displayed adjacent to the expression has been activated.

10. The computer-implemented method of claim 8, further comprising setting the debugger to enable evaluation of all expressions.

11. The computer-implemented method of claim 1, further comprising:
    detecting that the expression is entered into the debugger; and
    responsively performing the initial evaluation of the expression.

12. The computer-implemented method of claim 11, further comprising:
    if the first time period expires prior to completing the initial evaluation, then determining that an evaluation error has occurred.

13. The computer-implemented method of claim 11, further comprising indicating that the expression needs to be refreshed if an evaluation error occurs during the initial evaluation.

14. A computer-readable storage medium having computer executable instructions that, when executed, cause a computer to:
    detect entry of an expression in an expression interface;
    in response to detecting the entry of the expression, perform an initial evaluation of the expression with a debugger set to enable automatic reevaluation of all expressions within a first time period of a corresponding first evaluation of the expressions;
    detect an action that causes a value of the expression to become stale, wherein the following actions cause the expression to become stale: evaluating another expression, switching threads, changing a process, switching call stack frames or when a user steps through a line of code in the debugger;
    set the debugger to disable automatic reevaluation of selected expressions;
    decrease a time period during which reevaluation of expressions must be completed to a second time period shorter than the first time period;
    responsively evaluate the expression; and
    if evaluation of the expression does not succeed, return an error message and indicate that the expression needs to be refreshed by changing a font used to display the expression in the expression interface and displaying a refresh icon adjacent to a value of the expression.

15. A system for evaluating an expression, the system comprising:

a processor;

a memory in electrical communication with the processor;

a debugger executing in the processor that performs an initial evaluation of the expression with a setting to enable automatic reevaluation of all expressions within a first time period of a corresponding first evaluation of the expressions, detects an action that causes a value of the expression to become stale, wherein the following actions cause the expression to become stale: evaluating another expression, switching threads, changing a process, switching call stack frames or when a user steps through a line of code in the debugger and, in response, setting the debugger to disable automatic reevaluation of selected expressions, decreases a time period during which reevaluation of expressions must be completed to a second time period shorter than the first time period, and commands an expression evaluator to evaluate the expression; and the expression evaluator evaluates the expression.

16. The system of claim 15, wherein the selected expressions are explicit expressions.

17. The system of claim 15, wherein the selected expressions are explicit and implicit expressions.

18. The system of claim 15, wherein the debugger provides an indication that the expression needs to be refreshed if an evaluation error occurred while evaluating the expression.

19. The system of claim 18, wherein the indication comprises displaying the expression in grayed out font and displaying a refresh icon adjacent to the expression.

20. The system of claim 19, wherein the debugger commands the expression evaluator to reevaluate the expression with the setting to disable automatic reevaluation of selected expressions in response to an activation of the refresh icon.

* * * * *

UNITED STATES PATENT AND TRADEMARK OFFICE
CERTIFICATE OF CORRECTION

| | | |
|---|---|---|
| PATENT NO. | : 7,636,913 B2 | Page 1 of 1 |
| APPLICATION NO. | : 11/158700 | |
| DATED | : December 22, 2009 | |
| INVENTOR(S) | : Habib Heydarian et al. | |

It is certified that error appears in the above-identified patent and that said Letters Patent is hereby corrected as shown below:

In column 13, line 17, in Claim 15, after "debugger" insert -- , --.

Signed and Sealed this
Eighth Day of February, 2011

David J. Kappos
*Director of the United States Patent and Trademark Office*